United States Patent

Yamana

[19]

[11] Patent Number: 6,100,015
[45] Date of Patent: Aug. 8, 2000

[54] RESIST PATTERN FORMING METHOD

[75] Inventor: Mitsuharu Yamana, Tokyo, Japan

[73] Assignee: NEC Corporation, Tokyo, Japan

[21] Appl. No.: 09/027,736

[22] Filed: Feb. 23, 1998

[30] Foreign Application Priority Data

Feb. 24, 1997 [JP] Japan ..................................... 9-039121

[51] Int. Cl.[7] .................................................... G03F 7/00
[52] U.S. Cl. ...................... 430/322; 430/270.1; 430/327
[58] Field of Search .................................... 430/311, 322,
430/270.1, 327

[56] References Cited

U.S. PATENT DOCUMENTS

| 5,240,812 | 8/1993 | Conley | 430/273 |
| 5,609,688 | 3/1997 | Hayashi | 118/715 |
| 5,833,726 | 11/1998 | Kinkead | 55/356 |

FOREIGN PATENT DOCUMENTS

| 4-44045 | 2/1992 | Japan . |
| 4-369211 | 12/1992 | Japan . |
| 6-140299 | 5/1994 | Japan . |
| 7-142312 | 6/1995 | Japan . |

OTHER PUBLICATIONS

H. Yoshino, et al., "Investigation of Environmental Stability in Chemically Amplified Resists", *Microelectronic Engineering*, Vol. 35, pp. 153–156, 1997.

*Primary Examiner*—Kathleen Duda
*Attorney, Agent, or Firm*—Foley & Lardner

[57] ABSTRACT

In formation of a resist pattern using a chemical amplification type resist, a conspicuous sparingly soluble surface layer and film reduction are suppressed by controlling the ammonia concentration in the exposure/development atmosphere to the range of 2 to 9 ppb, thereby eliminating formation of a T-shaped resist pattern and film reduction. With this method, formation of the T-shaped resist pattern and film reduction are almost completely eliminated, so a rectangular resist pattern can be obtained, and additionally, the focal depth and dimensional accuracy can be improved.

2 Claims, 4 Drawing Sheets

RESIST PATTERN FORMING METHOD

BACKGROUND OF THE INVENTION

1. Field of the Invention

The present invention relates to a resist pattern forming method in semiconductor device manufacturing techniques and, more particularly, to a method of exposing a chemical amplification type photoresist film formed on a semiconductor substrate through a reticle on which a desired semiconductor integrated circuit pattern is drawn or a mask in an exposure atmosphere containing ammonia at a concentration of 2 to 9 ppb and developing the pattern using a developing solution after baking (PEB) to form a rectangular resist pattern.

2. Description of the Prior Art

In a chemical amplification type resist and, more specifically, a two-component system positive resist (e.g., Japanese Unexamined Patent Publication No. 4-44045) containing a protective polyvinyl phenolic resin and a photo-acid generator, or a three-component system positive resist obtained upon adding protective bisphenol A to the two-component system positive resist as a dissolution inhibitor, an acid generated upon exposure is neutralized in the resist film surface region by a basic substance (mainly ammonia) entering the resist film from the exposure atmosphere and deactivated. Since a protective group elimination reaction does not progress in the subsequent PEB (baking) reaction, a sparingly soluble surface layer is generated. For this reason, a T-shaped resist pattern is formed after development, as shown in FIG. 2, resulting in degradation in resolution, focal depth, or dimensional accuracy.

To solve these problems, some methods have been conventionally proposed. For example, the PEB atmosphere is replaced with an inert gas to prevent acid deactivation (Japanese Unexamined Patent Publication No. 4-369211), or processes from pattern exposure to development are performed in an atmosphere containing no gas impurity (Japanese Unexamined Patent Publication No. 6-140299). Especially, a method of attaching a chemical filter to the coating/developing unit and performing PEB and development under an atmosphere at an ammonia concentration lower than 1 ppb to prevent acid deactivation (Japanese Patent Publication No. 7-142312) is widely used.

As described above, the method of controlling the ammonia concentration in the exposure/development atmosphere to be smaller than 1 ppb using the chemical filter is most popular. Therefore, a demand has arisen for a chemical amplification type resist which is excellent in the environmental resistance and minimizes the dimensional variation even when the chemical filter does not function due to some reason.

However, not only a resist using a tBOC (t-butoxycarbonyl) protective resin but also a resist using an acetal-based protective group which is said to be more excellent in the environmental resistance than the tBOC protective resist, or an annealing type resist (UVII or UVIII available from Shipley) can hardly completely overcome the dependence on ammonia concentration.

If these resists are exposed and developed in an atmosphere containing ammonia at a concentration higher than 10 ppb, the tBOC protective resist has a conspicuous T shape, as shown in FIG. 2, and a system more excellent in the environmental resistance than the tBOC resist degrades in the stand-still resistance after exposure because the ammonia concentration is relatively high although the sparingly soluble surface layer is rarely generated.

In a method of attaching a chemical filter 303 to a conventional coating/developing unit 300 and performing PEB/development in an atmosphere at an ammonia concentration lower than 1 ppb using an excimer laser beam 304 to prevent acid deactivation, an excessive acid 305 is generated and diffused to unexposed portions to induce the protective group elimination reaction. In this case, as shown in FIGS. 1A to 1E, in the tBOC protective resist, the resist using the acetal-based protective group, or an annealing type resist 302, the upper portion of the pattern is cut to result in film reduction to a round shape (FIG. 1E), so no rectangular pattern cannot be obtained.

Reference numeral 301 in FIGS. 1A to 1E denotes a wafer as a substrate.

Especially, in forming a micropattern, the degradation in shape of the photoresist pattern, resolution, focal depth, and etching resistance due to such film reduction is fatal, and it is essential to improve the exposure atmosphere control method.

SUMMARY OF THE INVENTION

The present invention has been made in consideration of the above situation in the prior art, and has as its object to provide a resist pattern forming method which enables to suppress formation of a sparingly soluble surface layer due to acid deactivation on the resist surface, which is unique to a chemical amplification type resist, thereby preventing formation of a T-shaped resist pattern or film reduction of the resist pattern after development.

It is another object of the present invention to provide a resist pattern forming method allowing to obtain a rectangular resist pattern and ensure a highly integrated device pattern with greatly improved resolution, focal depth, and dimensional accuracy in the lithography and etching processes.

In order to achieve the above objects, according to the first aspect of the present invention, there is provided a resist pattern forming method comprising the step of exposing and developing a resist film formed on a semiconductor substrate while holding an ammonia concentration falling within a range of 2 to 9 ppb, whereby a rectangular resist pattern is formed.

According to the second aspect of the present invention, there is provided a resist pattern forming method of the first aspect, wherein the resist film essentially consists of a chemical amplification type resist.

According to the third aspect of the present invention, there is provided a resist pattern forming method of the second aspect, wherein the chemical amplification type resist is a resist using a tBOC protective resist.

According to the fourth aspect of the present invention, there is provided a resist pattern forming method of the second aspect, wherein the chemical amplification type resist is an annealing type resist.

According to the fifth aspect of the present invention, there is provided a resist pattern forming method of the second aspect, wherein the chemical amplification type resist is a resist using an acetal protective group.

As is apparent from the above aspects, according to the resist pattern forming method of the present invention, formation of a T-shaped pattern and film reduction can be almost completely eliminated, so a rectangular resist pattern can be obtained.

In addition, an optimum shape can be obtained for each resist type. When the ammonia concentration in the exposure/development atmosphere is optimized within the range of 2 to 9 ppb, both the focal depth and dimensional accuracy can be largely improved by, e.g., 7% or more. Especially, a large effect is obtained in forming a micropattern, so a rectangular photoresist pattern can be formed with a high reproducibility.

The above and many other objects, features and additional advantages of the present invention will become manifest to those versed in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Some preferred embodiments of the present invention will be described below with reference to the accompanying drawings.

In a chemical amplification type resist pattern forming method of the present invention, exposure and development are performed in an atmosphere containing ammonia at a concentration of 2 to 9 ppb to prevent a sparingly soluble surface layer as a factor for forming a T-shaped chemical amplification type resist pattern which is generated in pattern formation in a conventional clean room atmosphere (the ammonia concentration is about 10 to 30 ppb), and also prevent film reduction of the chemical amplification type resist pattern which is generated in pattern formation in an atmosphere at an ammonia concentration lower than 1 ppb, thereby obtaining only a rectangular resist pattern.

When the ammonia concentration in the exposure/development atmosphere is controlled within the range of 2 to 9 ppb, an excessive acid generated by exposure is deactivated by ammonia, so a rectangular pattern can be stably obtained.

Figure 3:
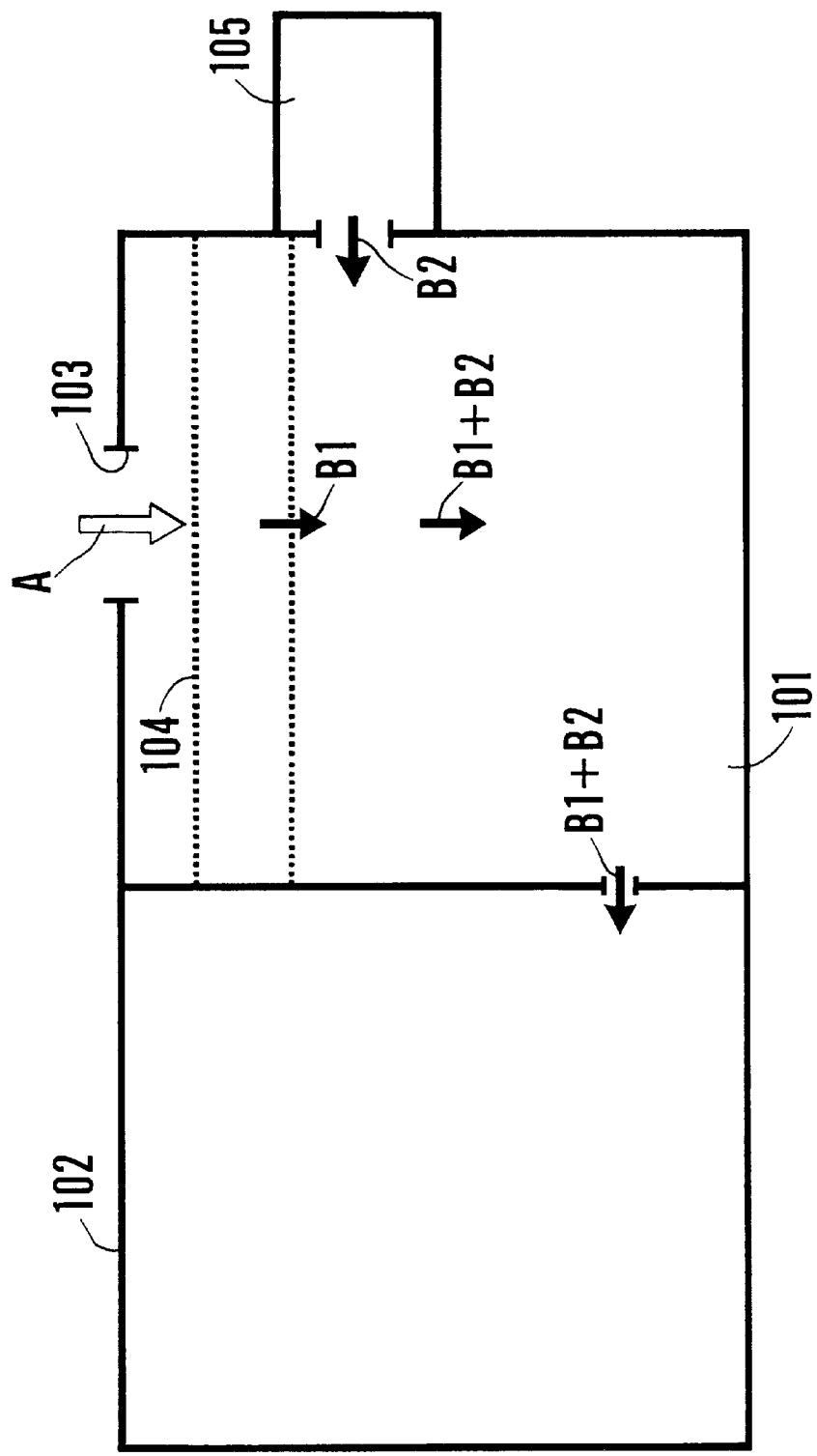
FIG. 3 is a schematic view showing the arrangement of a coating/developing unit in which exposure atmosphere is controlled to achieve a forming method of the present invention.

FIG. 3 schematically shows the coating/developing/exposure apparatus in which the exposure and development atmospheres are controlled. Reference numeral 101 denotes a coating/developing unit; and 102, an aligner.

In the coating/developing unit 101, outer air A is supplied through a vent hole 103. The supplied gas passes through a chemical filter 104, so the ammonia concentration in a gas B1 is controlled to be lower than 1 ppb.

Next, ammonia B2 at a concentration of 2 to 9 ppb is generated from a container 105 and supplied to the coating/developing unit. The ammonia concentration in atmosphere (B1+B2) in the coating/developing unit 101 and the aligner 102 is 2 to 9 ppb.

EXAMPLE 1

Figure 4A:
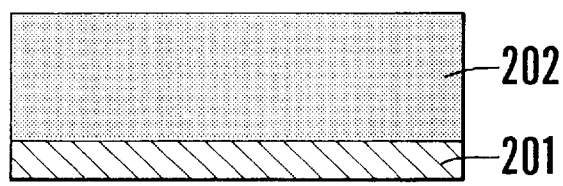
FIGS. 4A to 4D are sectional views showing steps in resist pattern formation of the present invention.
Figure 4B:
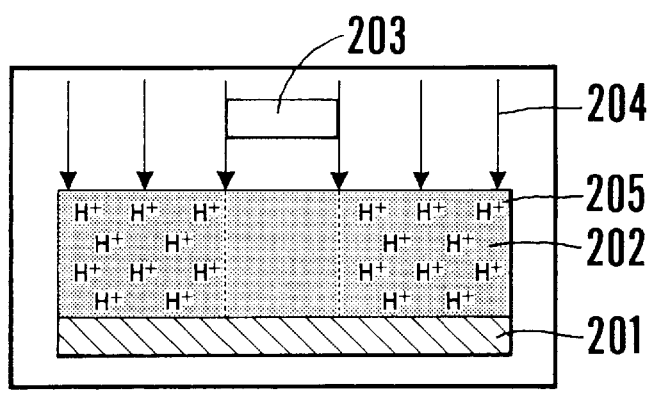

A resist film 202 was formed on a wafer 201 using a chemical amplification positive resist containing tBOC protective polyhydrostyrene resin and an acid generator, as shown in FIG. 4A. Under an atmosphere whose ammonia concentration was controlled within the range of 2 to 9 ppb (5 ppb) by the method of the present invention, the resist film was exposed by a KrF excimer laser through a reticle 203 on which a desired semiconductor integrated circuit pattern was drawn, as shown in FIG. 4B.

Figure 4C:
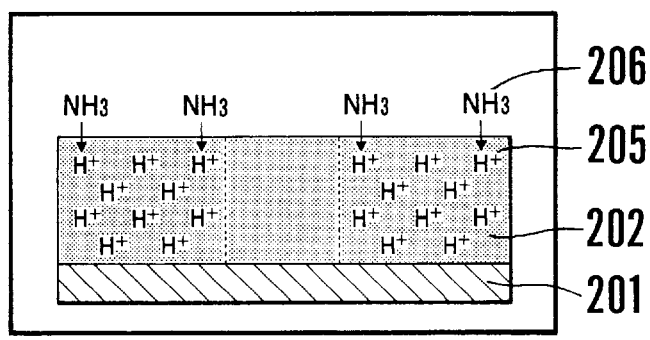
Figure 4D:
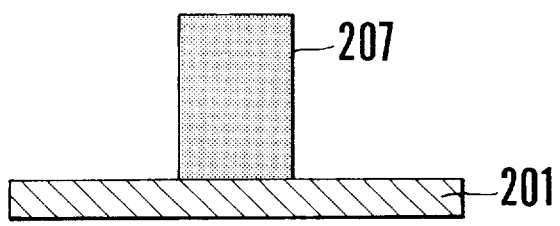

Acid 205 generated by exposure shown in FIG. 4C was partially deactivated by ammonia 206 in the atmosphere, so a rectangular pattern without film reduction could be obtained, as shown in FIG. 4D.

Figure 1A:
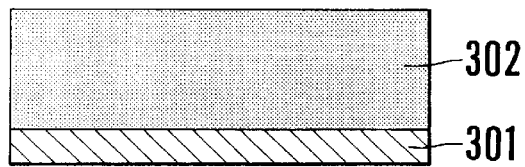
FIGS. 1A to 1E are sectional views showing steps in conventional formation of a resist pattern using a chemical amplification type resist.
Figure 1B:
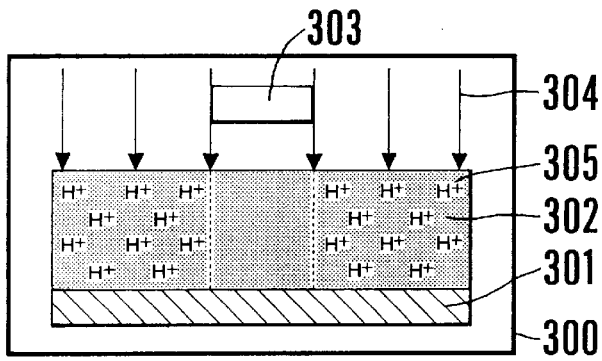
Figure 1C:
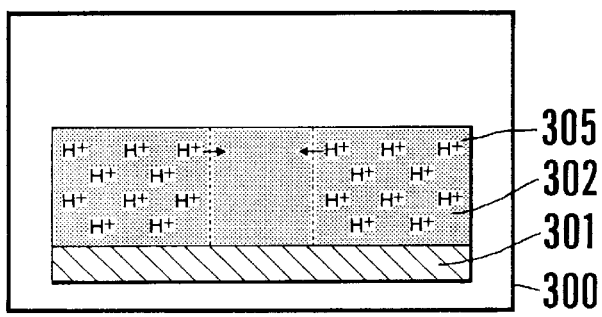
Figure 1D:
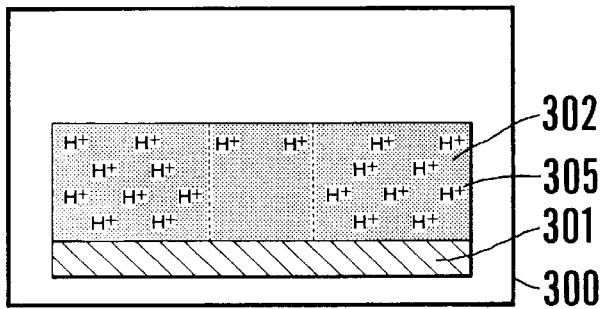
Figure 1E:
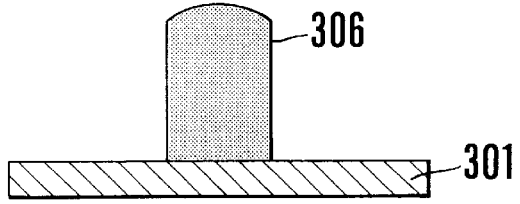
Figure 2:
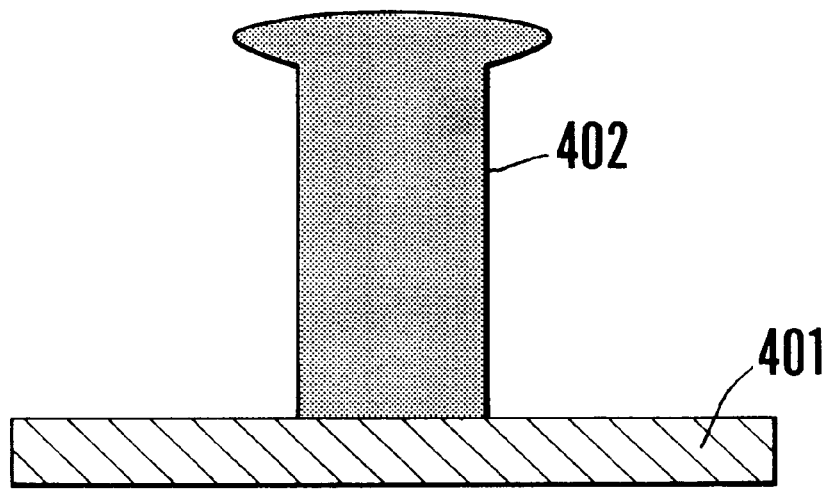
FIG. 2 is a sectional view showing the shape of the resist pattern formed by the conventional forming method.

However, under the conventional atmosphere at an ammonia concentration lower than 1 ppb, only a pattern with film reduction as shown in FIG. 1E was obtained even by the same processes as described above.

In addition, under the conventional atmosphere at an ammonia concentration of 10 ppb or more, only a pattern with film reduction as shown in FIG. 1E was obtained even by the same processes as described above.

EXAMPLE 2

Resist UVIIHS available from Shipley is an annealing type resist. The annealing type resist is applied to the wafer and then annealed at a temperature higher than the glass transfer temperature to cut the diffusion path, so the basic substance in the atmosphere is prevented from entering the resist. For this reason, the annealing type resist is more excellent in environmental resistance than the tBOC resist.

When a UVIIHS pattern was formed at an ammonia concentration of 2 to 9 ppb (2 ppb) following the same processes as in Example 1, a rectangular pattern as shown in FIG. 4B was obtained.

However, under the conventional atmosphere at an ammonia concentration lower than 1 ppb, only a pattern with film reduction as shown in FIG. 1E was obtained even by the same processes as described above.

In addition, under the conventional atmosphere at an ammonia concentration of 10 ppb or more, only a pattern with film reduction as shown in FIG. 1E was obtained even by the same processes as described above.

EXAMPLE 3

When a pattern was formed using a chemical amplification positive resist containing a polyhydrostyrene resin protected by an acetal-based tetrahydropyranyl group and an acid generator at an ammonia concentration of 2 to 9 ppb (9 ppb) following the same processes as Example 1, a rectangular pattern as shown in FIG. 4D was obtained.

However, under the conventional atmosphere at an ammonia concentration lower than 1 ppb, only a pattern with film reduction as shown in FIG. 1E was obtained even by the same processes as described above.

In addition, under the conventional atmosphere at an ammonia concentration of 10 ppb or more, only a pattern with film reduction as shown in FIG. 1E was obtained even by the same processes as described above.

What is claimed is:

1. A method of forming a resist pattern, comprising:

supplying a first gas to a processing apparatus;

passing the first gas through a filter to reduce an ammonia concentration of the first gas to below 1 ppb;

supplying ammonia to the processing apparatus such that the ammonia concentration in the processing apparatus is between 2 and 9 ppb; and forming a resist pattern in the processing apparatus.

2. The method of claim 1, wherein:

the processing apparatus comprises a resist coating/developing unit and a resist aligning/exposing unit;

the step of supplying the first gas comprises supplying air to the coating/developing unit;

the step of supplying ammonia comprises supplying ammonia to the coating/developing unit such that the air in the coating/developing unit and in the aligning/exposing unit contains an ammonia concentration of 2–9 ppb; and the step of forming the resist pattern comprises exposing and developing a chemical amplification positive resist layer.

* * * * *